United States Patent
Moynihan et al.

[11] Patent Number: 5,659,346
[45] Date of Patent: Aug. 19, 1997

[54] SIMPLIFIED INK JET HEAD

[75] Inventors: Edward R. Moynihan, Plainfield; David W. Gailus, Merrimack; Robert G. Palifka, Orford, all of N.H.; Paul A. Hoisington, Norwich, Vt.

[73] Assignee: Spectra, Inc., Keene, N.H.

[21] Appl. No.: 215,301

[22] Filed: Mar. 21, 1994

[51] Int. Cl.$^6$ .................. B41J 2/14; B41J 2/16
[52] U.S. Cl. .................. 347/68; 29/890.1; 347/20; 347/54; 347/45; 347/47; 347/69; 347/70; 347/71; 347/72; 347/88; 347/92; 347/67
[58] Field of Search .................. 347/20, 54, 45, 347/47, 68–72, 88, 92, 67; 310/363–366, 800; 29/890.1

[56] References Cited

U.S. PATENT DOCUMENTS

| | | | |
|---|---|---|---|
| 4,216,477 | 8/1980 | Matsuda et al. | 347/45 X |
| 4,422,082 | 12/1983 | Louzil . | |
| 4,571,599 | 2/1986 | Rezanka . | |
| 4,584,590 | 4/1986 | Fischbeck | 347/69 |
| 4,599,628 | 7/1986 | Doring et al. | 347/71 |
| 4,695,854 | 9/1987 | Cruz-Uribe | 347/71 |
| 4,698,644 | 10/1987 | Drago et al. . | |
| 4,835,554 | 5/1989 | Hoisington | 347/94 |
| 4,839,001 | 6/1989 | Bakewell . | |
| 4,937,598 | 6/1990 | Hine et al. | 347/92 |
| 4,940,995 | 7/1990 | Hine et al. | 347/92 |
| 4,947,184 | 8/1990 | Hoynihan | 347/92 X |
| 5,087,930 | 2/1992 | Roy et al. | 347/71 |
| 5,265,315 | 11/1993 | Hoisington et al. | 29/890.1 X |

FOREIGN PATENT DOCUMENTS

| | | |
|---|---|---|
| 0159188 | 10/1985 | European Pat. Off. . |
| 0413340 | 2/1991 | European Pat. Off. . |
| 0538147 | 4/1993 | European Pat. Off. . |
| 58-102521 | 6/1983 | Japan . |
| 60-198875 | 10/1985 | Japan . |
| 63-081051 | 4/1988 | Japan . |

OTHER PUBLICATIONS

European Patent Office, Supplementary European Search Report dated Oct. 1, 1996.

*Primary Examiner*—Huan H. Tran
*Attorney, Agent, or Firm*—Brumbaugh, Graves Donohue & Raymond

[57] ABSTRACT

In the embodiments of the simplified ink jet head described in the specification, a carbon plate is formed with orifice passages extending through the plate, pressure chambers on one side of the plate, flow-through passages on the other side of the plate and ink supply passages, and a piezoelectric plate having a conductive coating on the exposed side is affixed to the pressure chamber side of the carbon plate by a thin layer of epoxy adhesive. The conductive coating on the piezoelectric plate is photo-etched to produce an electrode pattern corresponding to the pattern of the pressure chambers in the carbon plate, and an orifice plate is affixed by a thin layer of epoxy adhesive to the opposite surface of the carbon plate with orifices aligned with the orifice passages in the carbon plate. Since the carbon plate is conductive, it can be used, if desired, as an electrode on the opposite side of the piezoelectric plate and, since it is porous, it can provide a communication path between a vacuum source and an air-permeable, ink-impermeable layer on the ink passages to remove dissolved air from the ink in the passages. In one alternative embodiment, the orifice passages are formed in an edge of the plate and, in another alternative embodiment, a large plate is provided on one surface with a number of adjacent piezoelectric plates.

33 Claims, 6 Drawing Sheets

SIMPLIFIED INK JET HEAD

BACKGROUND OF THE INVENTION

This invention relates to ink jet head arrangements and, more particularly, to a new and improved ink jet head arrangement having a simple and inexpensive structure.

Conventional ink jet heads, in which ink received from an ink reservoir is ejected selectively through a series of orifices, have been made using thin plates of metal or ceramic material having appropriate passages which are bonded together in adjacent relation in an assembly, as described, for example, in the Roy et al. U.S. Pat. No. 5,087,930 and the Hoisington et al. U.S. Pat. No. 4,835,554. In such arrangements, each chamber or passage in the flowpath leading from the ink inlet to the orifice, through which the ink is ultimately ejected, is provided in one or more of the several plates in the assembly. This requires an array of plates having different thicknesses, each of which must be separately machined to precise dimensions to produce the appropriate chambers and passages, and also requires precise positioning of all of the chambers and passages in the plates. Moreover, the plates must be assembled and bonded together and to a piezoelectric plate in highly precise alignment, and each plate must be flat and free from burrs that would cause voids between adjacent plates. Furthermore, because of differences in the coefficients of thermal expansion between the materials used in the plates, bond stresses are generated by temperature variations which occur in connection with the manufacture and use of the ink jet head which must be overcome.

Heretofore, some plates used in ink jet heads have been photo-etched to provide the appropriate chambers and passages, which has the advantage that the plates are generally burr-free and can be made from KOVAR metal alloy, stainless steel and other materials that have appropriate mechanical and thermal expansion characteristics. The materials useful for photo-etching, however, have drawbacks when used in connection with ink jet heads from which hot melt ink is ejected since they generally have low thermal conductivity. In addition, the photo-etching process has the disadvantage of being a batch process with lot-to-lot variations and, moreover, when used in this manner, produces a relatively large quantity of chemical waste.

Furthermore, conventional piezoelectric plates used in ink jet heads are thin, fragile and susceptible to damage during processing. Because of the greater likelihood of damage to larger plates, the maximum size of piezoelectric plates is normally quite small, for example, less than about 50 mm, which correspondingly limits the length of an array of orifices through which ink is ejected as a result of the actuation of the piezoelectric plate.

SUMMARY OF THE INVENTION

Accordingly, it is an object of the present invention to provide an ink jet head which overcomes the disadvantages of the prior art.

Another object of the invention is to provide an ink jet head having a simple structure which is convenient to manufacture and is capable of providing high resolution ink jet printing.

These and other objects and advantages of the invention are attained by providing an ink jet head having a carbon plate in which ink pressure chambers and connecting passages from ink supply lines and to ink jet orifices are formed in the carbon body. Preferably, the carbon plate has pressure chambers formed on one side and flow-through passages to permit continuous ink circulation through the pressure chambers formed on the other side of the plate with connecting passages leading to an orifice plate and to an ink supply extending through the carbon plate. In addition, an orifice plate is affixed to one side of the carbon plate with orifices aligned with orifice passages in the carbon plate and a piezoelectric plate is affixed to the other side of the carbon plate with actuating electrodes aligned with the pressure chambers to cause the piezoelectric material to be deflected so as to apply pressure to the corresponding pressure chamber and eject a drop of ink through a corresponding orifice in the orifice plate.

Because the carbon plate can be machined precisely without causing burrs using conventional machining techniques and, since carbon has a low thermal coefficient of expansion, dimensional variations resulting from thermal expansion during machining are minimized on the plate. In addition, the expansion coefficient is especially compatible with the piezoelectric plate which is affixed to it, thereby reducing or eliminating stresses between the plates which might otherwise be produced by temperature variations such as occur when the ink jet head is used with hot melt ink.

According to another aspect of the invention, the piezoelectric plate has actuating electrodes on only one side of the plate and is prepared by a photo-etching technique in which a piezoelectric plate coated on one side with electrode material is affixed to the pressure chamber side of the carbon plate with the electrode material-coated side exposed. The exposed side of the plate is coated with a photoresist material and is then exposed to a desired electrode pattern in precise alignment with the pressure chamber pattern in the carbon plate, after which the photoresist is developed, the exposed electrode material is etched away, and the remaining photoresist is removed to produce an electrode pattern conforming exactly in shape and position to the pattern of pressure chambers in the carbon plate. In addition, the electrode pattern thus formed on the piezoelectric plate can include other electrical elements such as a heater to heat ink in the passages in the carbon plate.

In accordance with a further aspect of the invention, the carbon plate is porous, preferably being about 80–90% dense, and the porosity and a vacuum source communicating with the surface of the plate can extract dissolved air from ink in the ink passages separated from the porous carbon material by an air-permeable, ink-impermeable layer. If desired, a page-size carbon plate can be prepared with a row of separate piezoelectric plates affixed to one side of the plate. Moreover, the carbon plate may have orifice passages formed in an edge of the plate rather than in one of the sides of the plate.

BRIEF DESCRIPTION OF THE DRAWINGS

Further objects and advantages of the invention will be apparent from a reading of the following description in conjunction with the accompanying drawings, in which.

DESCRIPTION OF PREFERRED EMBODIMENTS

Figure 1:
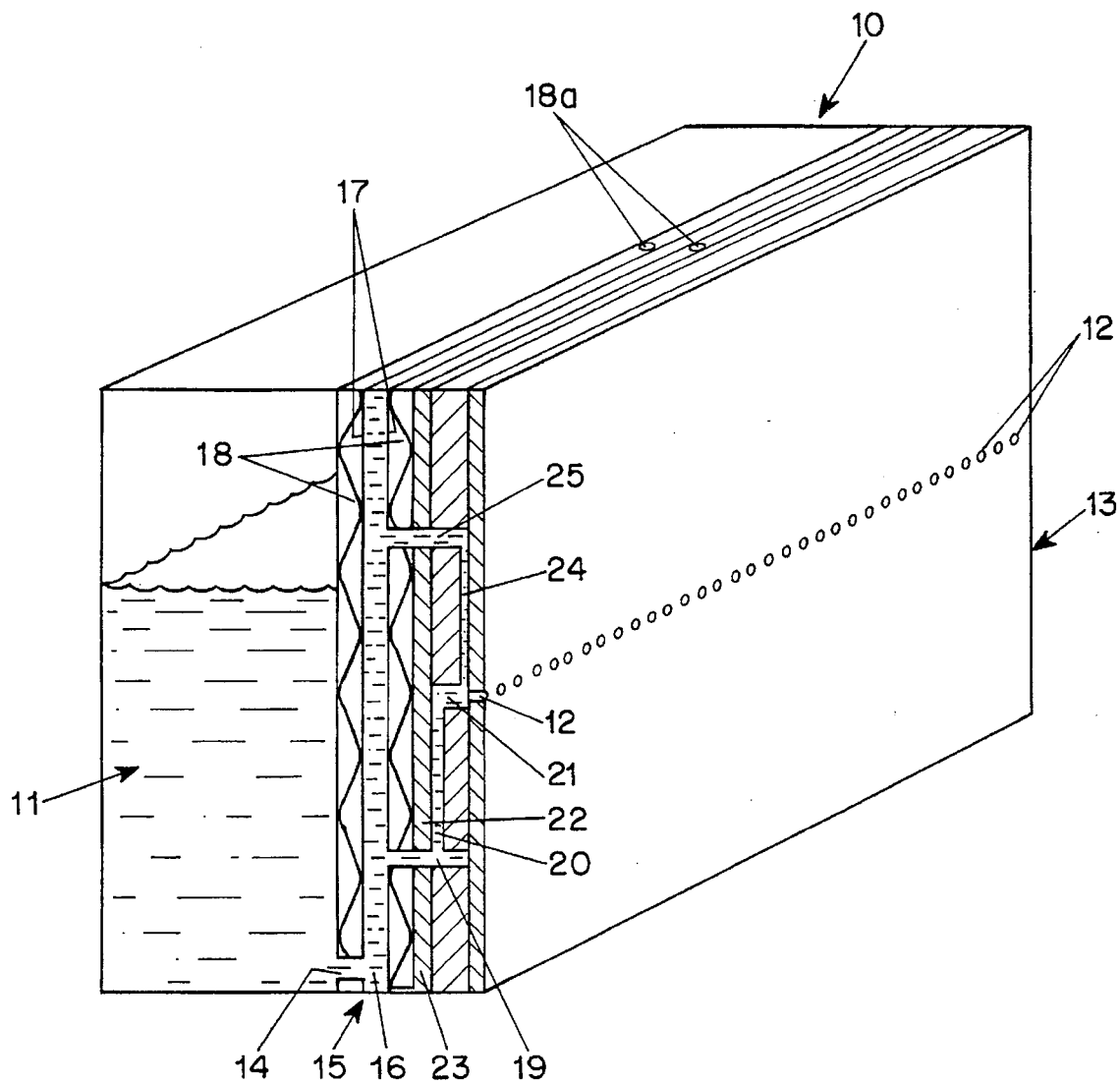
FIG. 1 is a schematic perspective sectional view illustrating a representative embodiment of a simplified ink jet head arranged in accordance with the invention.

In the typical embodiment of the invention schematically shown in FIG. 1, an ink jet head 10 includes a reservoir 11 on one side containing ink which is to be selectively ejected in the form of drops through an array of orifices 12 formed in an orifice plate 13 mounted on the opposite side of the head. Ink from the reservoir 11 is supplied through a passage 14 to a deaerator 15 in which an ink path 16 extends between air-permeable, ink-impermeable membranes 17, each of which is backed by a vacuum plenum 18 connected through ports 18a to a remote vacuum source (not shown) to extract dissolved air from the ink. Deaerated ink from the passage 16 is conveyed through a passage 19 to a pressure chamber 20 from which it is ejected on demand through an orifice passageway 21 and a corresponding orifice 12 in the orifice plate 13 in response to selective actuation of the adjacent portion 22 of a piezoelectric plate 23.

The general arrangement of the ink jet head 10 and the deaerator 15 is of the type described, for example, in the Hine et al. U.S. Pat. No. 4,937,598, the disclosure of which is incorporated herein by reference. The ink in the reservoir 11 may, if desired, be hot melt ink which is solid at room temperature and liquid at elevated temperatures, in which case heaters (not shown) are mounted at appropriate locations in the ink jet head 10.

In order to permit the ink supplied to the orifices to be deaerated continuously even though ink is not being ejected through the orifices 12, the head includes a flow-through passage 24 extending from each orifice passage 21 to a return passage 25 leading back to the deaeration path 16 in the deaerator 15, and a continuous slow circulation of ink through the passage 19, the chamber 20, the orifice passage 21, the flow-through passage 24 and the passage 25 back to the deaerator passage 16 is maintained by thermal convection, as described, for example, in the Hine et al. U.S. Pat. No. 4,940,995 issued Jul. 10, 1990, the disclosure of which is incorporated herein by reference. For this purpose, a heater (not shown in FIG. 1) is arranged to heat the ink near the lower end of the flowpaths consisting of the passages 19, 20, 21, 24 and 25 above its normal temperature to cause a convective flow of the ink through those passages, thereby conveying the ink back to the deaerator 16.

In accordance with the invention, the passages 19, 20, 21, 24 and 25 are formed in a plate 26 made of isotropic carbon graphite, which is preferably about 80–90% dense, providing a slightly porous plate structure. The carbon plate 26 is machined by micromachining techniques from opposite sides to produce the chambers and passages required for the ink jet head. The carbon plate can be machined by milling, broaching, grinding and the like, using conventional tools providing high material removal rates with minimum tool wear, to produce openings with much closer tolerances than the conventional metal plates of the type described, for example, in the Hoisington et al. U.S. Pat. No. 4,835,554. Because the carbon material is friable, no burrs are produced during machining. Moreover, the coefficient of thermal expansion of the isotropic carbon graphite body is substantially the same as that of the ceramic piezoelectric material of which the piezoelectric plate 23 is made so as to reduce or substantially eliminate thermal stresses which occur between those components of the head as a result of variations in temperature.

Figure 2:
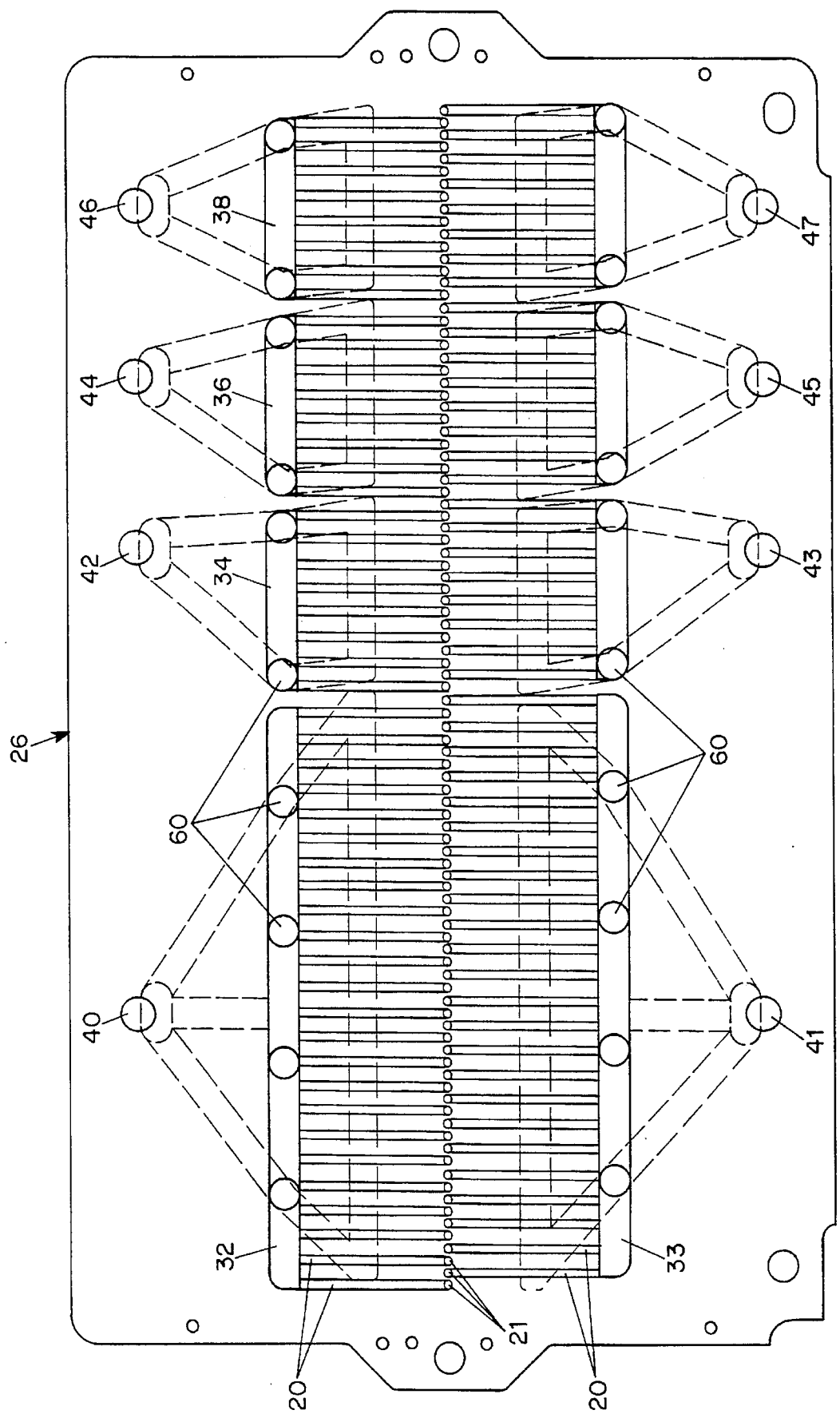
FIG. 2 is a plan view showing the pressure chamber side of a typical carbon plate for a multicolor ink jet head showing the arrangement of the pressure chambers and the related ink passages formed in the carbon plate.
Figure 3:
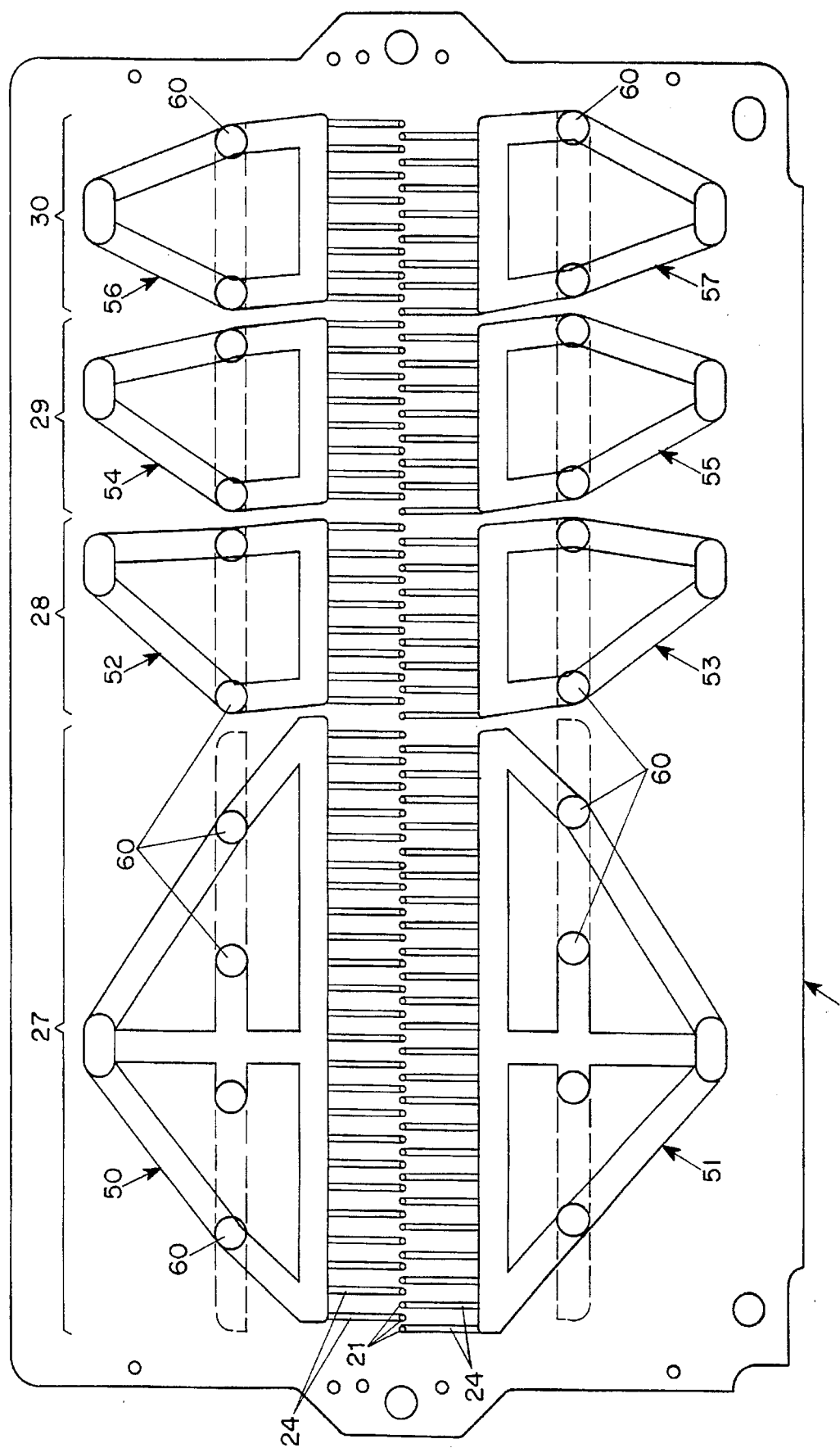
FIG. 3 is a view of the carbon plate of FIG. 2 from the same side shown in FIG. 2, but illustrating the passages formed in the opposite side of the carbon plate.

FIG. 2 illustrates a representative arrangement of pressure chambers 20 and orifice passages 21 as viewed from the piezoelectric plate side of the carbon monolithic plate 26, while FIG. 3 illustrates the other ends of the orifice passages 21 and the flow-through passages 24 which are formed in the opposite side of the monolithic array 26. FIG. 3, while showing the passages on the side of the monolithic array 26 which face the orifice plate 13, is illustrated with the passages seen as they would be viewed in the same direction as FIG. 2.

FIGS. 2 and 3 show supply passages for supplying four different color inks, e.g., black, yellow, magenta and cyan, to four different groups 27, 28, 29 and 30 of the orifice passages 21. Since black ink is normally used to a much greater extent than the colored inks, half of the orifice passages 21 are arranged to supply black ink, and one-third of each of the remaining passages are arranged to supply each of the colored inks.

As illustrated in FIG. 2, the pressure chambers 20 of the array are alternately disposed on opposite sides of the line of orifice passages 21 and are supplied from grooves formed in the pressure chamber side of the graphite plate 26, for example, from grooves 32 and 33 supplying black ink, grooves 34 and 35 supplying magenta ink, grooves 36 and 37 supplying yellow ink, and grooves 38 and 39 supplying cyan ink. The appropriate color ink is supplied to these grooves through corresponding apertures 40 and 41, 42 and 43, 44 and 45 and 46 and 47, which extend through the carbon plate 26 to corresponding sets of grooves 50 and 51, 52 and 53, 54 and 55 and 56 and 57, formed in the opposite side of the plate. Those grooves, shown in solid lines in FIG. 3 and in dotted lines in FIG. 2, communicate with further apertures 60 corresponding to the passages 19 and 25 of FIG. 1, which extend through the plate to convey ink from the deaerator ink path 16 of FIG. 1 to the pressure chamber supply grooves 32–39. As shown in FIG. 3, the flow-through passages 24 convey ink between the orifice passages 21 and the groove patterns 50–57 on the opposite side of the carbon plate to complete the continuous path for circulation of ink through the deaerator 15.

In addition, the carbon plate 26 is especially advantageous for ink jet heads used with hot melt ink. Because of its high thermal conductivity, the carbon plate provides excellent heat conduction from heaters mounted at relatively remote locations in the head to all of the ink passages in the head. This assures that the hot melt ink at each of the orifices 12 is at the same temperature and therefore has the same viscosity, thereby providing good uniformity of operation throughout the length of the array of orifices.

A typical carbon plate 26 may be about 2 mm thick and have orifice passages 21 about 0.2 mm in diameter, pressure chambers about 9 mm long, 0.5 mm wide and 0.2 mm deep, supply grooves about 1.0 to 1.5 mm wide and 0.5 mm deep, flow-through passages about 4 mm long, 0.1 mm wide and 0.05 mm deep, and apertures 60 about 1.5 mm in diameter. With this arrangement, a 96-aperture linear array of the type shown in the drawings can be provided in a carbon plate 26 having dimensions of about 4 cm by 7 cm with the orifice passages 21 spaced by about 0.5 mm. When oriented at an appropriate angle with respect to the scanning direction, an ink jet head using an array of this type can produce a resolution of about 300 dots per inch (120 dots per cm) in the subscanning direction and, when actuated at a rate of about 14 Khz at a scanning rate of 1 m/sec to produce 100 picoliter drops, can produce the same resolution in the scanning direction.

In certain high-frequency ink jet applications, the rigidity of the walls of the pressure chambers 20 formed in the carbon plate may be less than desired, requiring a higher operating voltage for the piezoelectric actuating plate. To alleviate this, the surfaces of the pressure chambers 20 formed in the carbon plate may be coated with a thin layer, such as 0.01 to 0.1 mm thick, of a very hard (i.e., high modulus of rigidity) material such as a carbide or nitride, e.g., silicon carbide or nitride, boron carbide or nitride, tungsten carbide or nitride, tantalum carbide or nitride, or the like. Preferably, the coating is applied by chemical vapor deposition.

Figure 4:
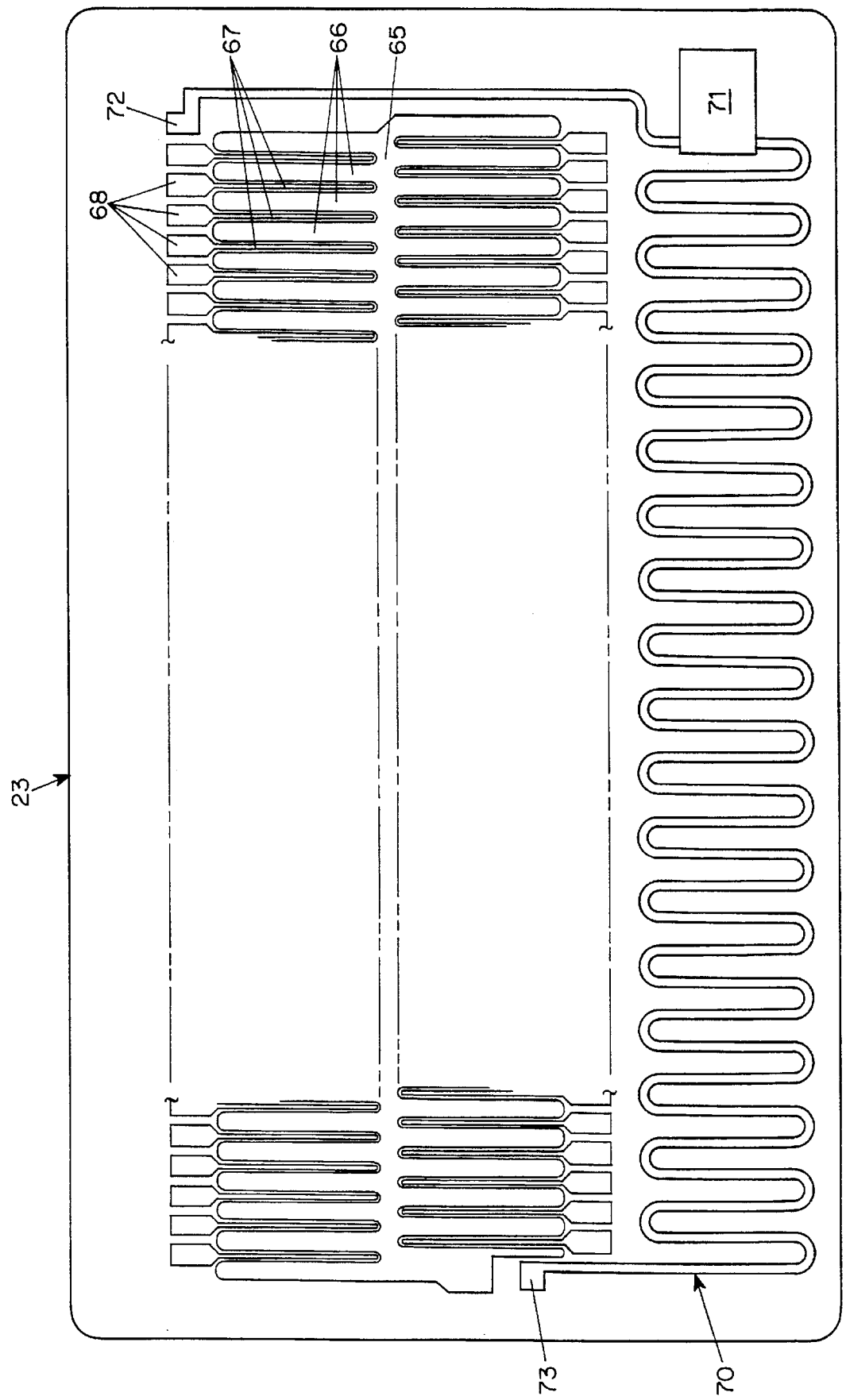
FIG. 4 is a schematic view illustrating a typical arrangement of electrodes on the exposed surface of a piezoelectric plate used with the carbon plate shown in FIGS. 2 and 3.

In order to actuate the piezoelectric plate 23 so as to selectively eject ink from the pressure chambers 20 through the orifice passages 21 and through corresponding orifices 12 in the orifice plate 13, the piezoelectric plate 23, which is mounted on the pressure chamber side of the carbon plate, has no electrodes on the carbon plate side and is patterned with an electrode array of the type shown in FIG. 4 on the exposed side. In the array shown in FIG. 4, a common electrode 65 extends along the portion covering the orifice passage array in the carbon plate and also extends laterally into regions 66 over the carbon plate surface portions between the pressure chambers.

Interlaced between the lateral extensions 66 is a spaced array of individual electrodes 67 which are positioned directly over the pressure chambers in the carbon plate so that, when selectively actuated by application of appropriate potential to a corresponding terminal 68, the piezoelectric plate 23 is mechanically distorted in the shear mode in the direction toward the adjacent pressure chamber 20 so as to cause ejection of an ink drop from the orifice with which that pressure chamber communicates. Shear-mode operation of a piezoelectric plate is described, for example, in the Fischbeck et al. U.S. Pat. No. 4,584,590, the disclosure of which is incorporated herein by reference. Such shear-mode operation does not require any electrode on the opposite side of the piezoelectric plate but, if desired, the carbon plate 26, being conductive, can be used to provide an electrode on the opposite side of the plate.

The electrode pattern shown in FIG. 4 also includes a heater conductor 70 having a thermistor temperature control switch 71 extending between two terminals 72 and 73 and arranged to heat the ink in the passages in the lower portion of the carbon plate 26 so as to cause circulation of the ink in the manner described above by thermal convection. Because the carbon material in the plate 26 has a high thermal conductivity, the plate acts as a thermal conductor between the heater and the adjacent ink passages in the plate.

In order to form an electrode pattern of the type shown in FIG. 4 on the piezoelectric plate 23, the plate, which is initially provided with a continuous conductive coating on the exposed side, is permanently affixed by an epoxy adhesive to the pressure chamber side of the carbon plate 26. Since the carbon plate is slightly porous, an epoxy adhesive can be used to mount not only the piezoelectric plate 23, but also the orifice plate 13, to the opposite surfaces of the carbon body. For this purpose, one of the surfaces of the plates to be joined is preferably spray-coated with a layer of B-stage epoxy adhesive about 2 microns thick before the piezoelectric plate 23 or the orifice plate is applied to it. Such a thin layer of epoxy adhesive provides excellent seals between the plates, including the very narrow portions between the orifice passages, but does not flow into the passages or apertures in such a way as to interfere with the operation of the head.

The orifices 12 in the orifice plate 13, which may be a stainless steel plate about 0.05 mm thick, are preferably about 0.05 mm in diameter and are formed by electrical discharge machining. By selecting the appropriate size wire and controlling the current/voltage profile, the size and shape of the orifice can be controlled accurately. Bonding of the orifice plate to the surface of the carbon body is accomplished in the same way as the bonding of the piezoelectric plate.

After the piezoelectric plate 23 has been affixed to the carbon plate, a layer of photoresist material is coated on the exposed surface and, using the precisely known positions of the pressure chambers from a reference edge in the carbon body, the photoresist is exposed to produce a pattern which corresponds exactly with the locations of the pressure chambers, and the unexposed resist is removed in the usual manner. Thereafter, the conductive layer is etched away from the exposed surface of the piezoelectric plate and the remaining resist is then removed to provide the final electrode pattern.

In this way, the piezoelectric plate 23, which is preferably only about 0.1 to 0.25 mm thick and is quite fragile, is protected from damage during the formation of the electrode pattern and other head-manufacturing steps. Consequently, substantially large piezoelectric plates, for example, 50 mm by 100 mm or more, can be used without substantial risk of damage during processing. Moreover, large-scale production is facilitated since a large-size carbon plate can be machined with multiple identical or similar patterns, and a corresponding number of piezoelectric plates can be bonded to the pattern locations on the large sheet and simultaneously exposed and etched to form electrode patterns corresponding precisely to the structures of the adjacent portions of the carbon plate, after which the large-size plate is separated into individual plates.

Figure 5:
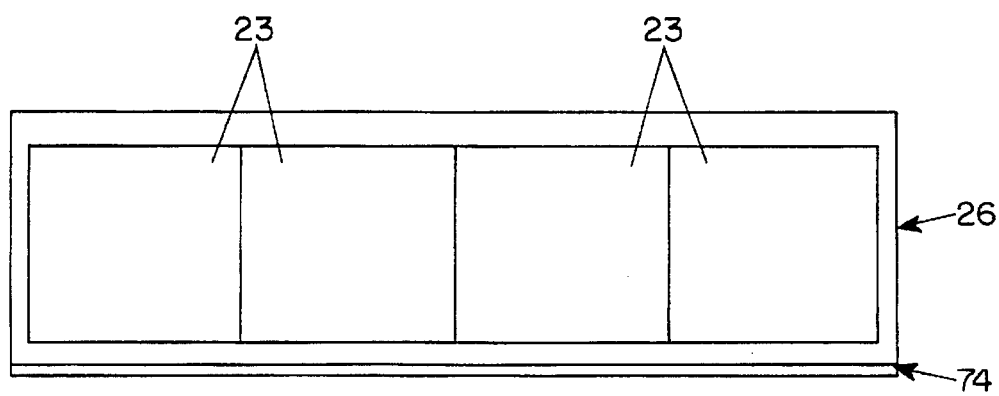
FIG. 5 is a schematic plan view of a typical large-size carbon plate having a series of piezoelectric plates mounted on one surface in accordance with another embodiment of the invention.

Furthermore, instead of separating a large-size carbon plate into smaller plates, a single carbon plate 20 cm wide, or even 150 cm wide, if appropriate, may be made to provide a page-width ink jet head by mounting a row of piezoelectric plates to one surface and simultaneously processing the piezoelectric plates in the manner described above. A typical page-width ink jet head is shown in FIG. 5, in which a carbon plate 26 has a row of adjacent piezoelectric plates 23 affixed to one side. The ink jet head of FIG. 5 has internal passages arranged to supply ink to an orifice plate 74 mounted on one edge, as described hereinafter with respect to FIG. 8. Alternatively, if desired, the large-size plate 26 of FIG. 5 may have internal passages of the type described above with respect to FIG. 1 leading to an orifice plate (not shown in FIG. 5) mounted on the opposite side of the carbon plate.

Figure 6:
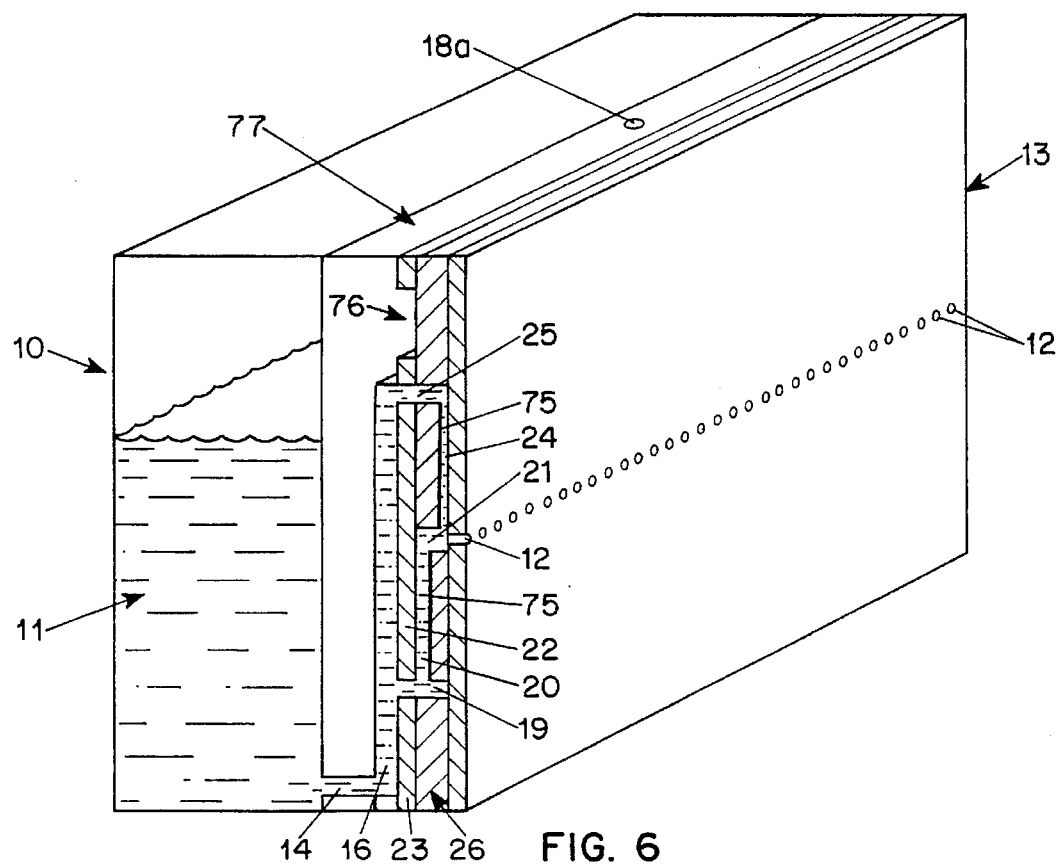
FIG. 6 is a schematic perspective view illustrating another representative embodiment of the invention.

As an alternative to the deaerator arrangement 15 shown in FIG. 1, the use of a carbon plate 26 which is slightly porous permits the plate to act as a conduit between the vacuum plenum and the ink in the passages within the carbon plate in the manner shown in the alternative embodiment of FIG. 6 so that dissolved air can be extracted. For this purpose, the surfaces of the plate passages are coated with a layer 75 of an air-permeable, ink-impermeable epoxy resin and one or more openings 76 are provided in the piezoelectric plate 23 to expose the adjacent surface of the carbon plate 26 to a vacuum source 77 which replaces the deaerator 15, the other exposed surfaces of the carbon plate 26 being sealed to prevent entry of air into the porous plate. The vacuum source 77 may be connected to a remote vacuum supply through the port 18a, or it may be a replaceable vacuum reservoir of the type described in the copending Hine application Ser. No. 08/143,165, filed Oct. 26, 1993, the disclosure of which is incorporated herein by reference.

Figure 7:
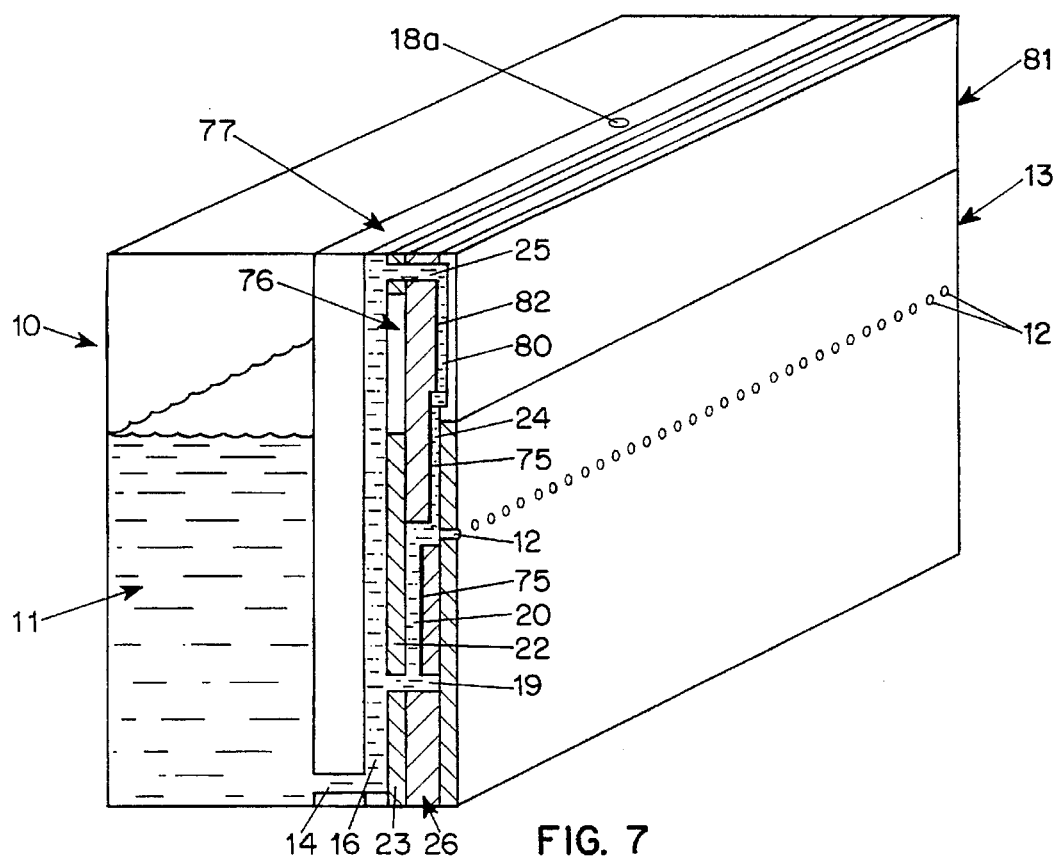
FIG. 7 is a schematic perspective sectional view similar to FIG. 6, illustrating another typical embodiment of the invention.

In another modified deaerator arrangement shown in FIG. 7, ink passages 80 extending between the passages 24 and 25 are formed in a plate 81 which is mounted on the front surface of the carbon plate 26 and an air-permeable, ink-impermeable membrane 82, similar to the membranes 17 of FIG. 1, is positioned between the carbon plate 26 and the plate 81. In this case, the coating 75 applied to the various passages within the carbon plate 26 is impermeable to air and only the portion of the plate 26 adjacent to the membrane 82 is used to extract air from the ink in the passages 80. If desired, a filter may also be incorporated in the plate 81 in the path of the ink between the passages 24 and 25. Otherwise, the arrangement of FIG. 7 is the same as that shown in FIG. 6.

Because the high thermal conductivity of the carbon plate 26 assures heat conduction from relatively remote heaters through the carbon plate to hot melt ink adjacent to an orifice plate, a hot melt ink jet head according to the invention may be arranged so that the ink is ejected from an orifice plate mounted on an edge of a carbon plate rather than from an orifice plate mounted on one side of the carbon plate. Moreover, even if the ink used in the ink jet head is not hot melt ink, the easy machinability of the carbon plate provides a distinct advantage in an arrangement of this type in contrast to a conventional laminated plate arrangement, in which edges of the plates adjacent to the orifice plate cannot be perfectly aligned, leading to irregularities in the mounting of the orifice plate.

Figure 8:
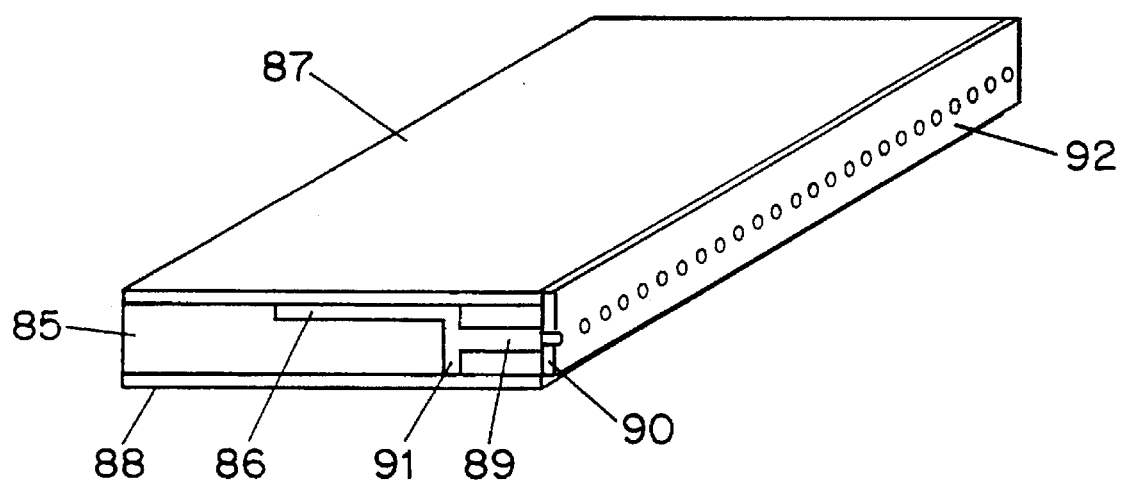
FIG. 8 is a schematic perspective view illustrating a further representative embodiment of the invention.

This arrangement is shown in FIG. 8, in which a carbon plate 85 has pressure chambers 86 formed in one side and a piezoelectric plate 87 affixed to that side of the plate, and a bottom cover plate 88 affixed to the opposite side of the plate. A row of orifice passages 89, which are drilled into one edge 90 of the carbon plate 85, communicate with the pressure chambers 86 through perpendicular passages 91 extending through the plate 85. With a carbon plate 85 of this type, the end surface 90 can be ground perfectly flat and the plate can then be drilled to form the passages 89 and 91 to connect with the pressure chambers 88, after which an orifice plate 92 is affixed to the edge 90 by epoxy adhesive in the manner described above.

An ink jet head made in this way is especially advantageous, not only because it requires only a very narrow strip for the orifice plate 92, but also because it permits the bulk of the printhead to be spaced from the paper path and also permits stacking of multiple printheads.

Figure 9:
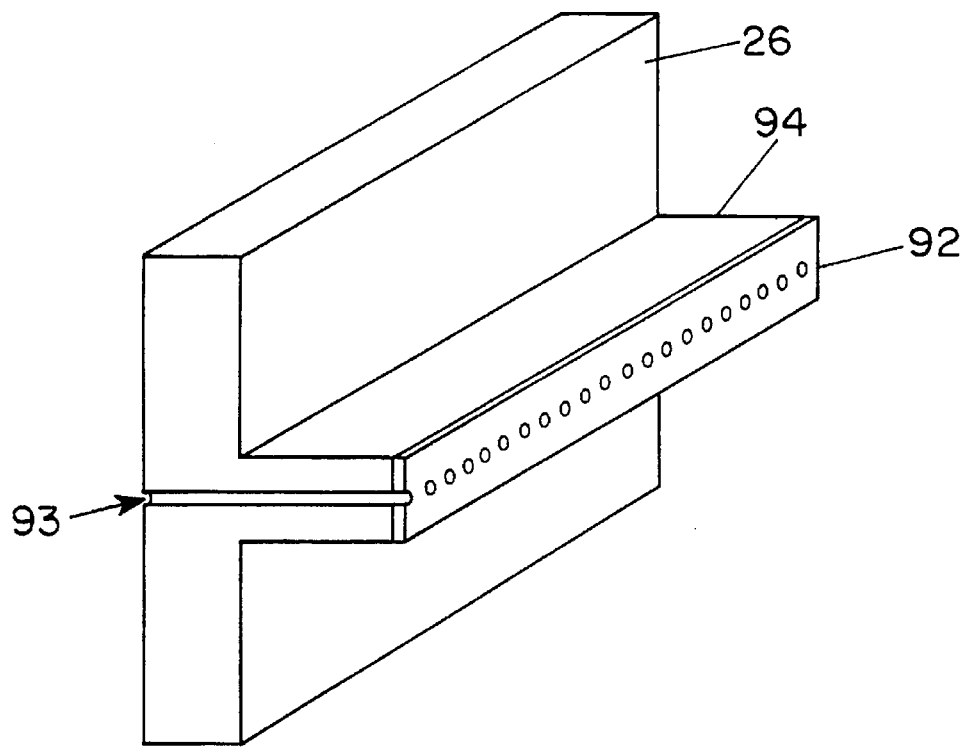
FIG. 9 is a fragmentary perspective view illustrating a modified form of the invention.

If desired, the ink jet head of FIG. 1 can be modified to provide similar advantages by forming the carbon plate 26 with a projecting portion 92 through which orifice passages 93 extend to an orifice plate 94, as illustrated in FIG. 9.

With the simplified ink jet head according to the invention, the problems caused by burrs and dimensional variations resulting from heat produced in machining, by differences in temperature coefficient of expansion of the materials used in the ink jet head, and by the necessity for assembling a number of previously formed plates in precise relation, and the problems of bond stresses during temperature cycling are effectively eliminated in a convenient and inexpensive manner. Moreover, the number of steps required for the formation of the electrode pattern on the piezoelectric plate and application of the plate to the ink jet head is substantially reduced and variations in electrode positioning with respect to the pressure chamber positions are eliminated.

Although the invention has been described herein with reference to specific embodiments, many modifications and variations therein will readily occur to those skilled in the art. Accordingly, all such variations and modifications are included within the intended scope of the invention.

We claim:

1. An ink jet head comprising an orifice plate having orifices through which ink is selectively ejected, a carbon plate formed with orifice passages leading to the orifices in the orifice plate and formed on one side with pressure chambers communicating with the orifice passages and formed with ink supply passages leading to the pressure chambers, and a piezoelectric plate having one side affixed to the side of the carbon plate in which the pressure chambers are formed and provided on an opposite side with an electrode pattern corresponding to the pattern of pressure chambers in the carbon plate.

2. An ink jet head according to claim 1 wherein the orifice plate is affixed to the side of the carbon plate opposite from the piezoelectric plate and including flow-through passages formed on the side of the carbon plate adjacent to the orifice plate leading from the orifice passages to the ink supply passages.

3. An ink jet head according to claim 1 wherein the carbon plate has an edge in which the orifice passages are formed and wherein the orifice plate is affixed to the edge of the carbon plate containing the orifice passages.

4. An ink jet head according to claim 1 wherein the carbon plate is about 10–20% porous.

5. An ink jet head according to claim 1 including a thin layer of epoxy adhesive between the piezoelectric plate and the carbon plate.

6. An ink jet head according to claim 1 including a heating element formed on a surface of the piezoelectric plate.

7. An ink jet head according to claim 1 including a thin layer of epoxy adhesive between the orifice plate and the carbon plate.

8. An ink jet head according to claim 1 including a plurality of sets of orifice passages in the carbon plate and a plurality of separate ink supply passages for supplying different colored ink to each set of orifice passages.

9. An ink jet head according to claim 1 including deaeration means for deaerating ink in the ink jet head.

10. An ink jet head according to claim 9 wherein the deaeration means includes an air-permeable, ink-impermeable layer adjacent to an ink flowpath in the ink jet head and a vacuum source communicating with the air-permeable, ink-impermeable layer.

11. An ink jet head according to claim 10 wherein the carbon plate is porous and wherein the vacuum source communicates with the air-permeable, ink-impermeable layer through the porous carbon plate.

12. An ink jet head according to claim 11 wherein the air-permeable, ink-impermeable layer is a coating on surfaces of passages formed in the carbon plate.

13. An ink jet head according to claim 11 wherein the air-permeable, ink-impermeable layer is a membrane disposed between a portion of the carbon plate and an adjacent ink passage in the ink jet head.

14. An ink jet head according to claim 13 wherein the adjacent ink passage is formed in a further plate affixed to the carbon plate.

15. An ink jet head according to claim 9 wherein the orifice plate is affixed to one side of the carbon plate and including flow-through passages formed on the side of the carbon plate adjacent to the orifice plate leading from the orifice passages to the ink supply passages to permit circulation of ink through the passages and through the deaeration means.

16. An ink jet head according to claim 15 including heater means formed on the piezoelectric plate to heat ink in the passages in the carbon plate and produce thermal convective circulation thereof through the passages and the deaeration means.

17. An ink jet head according to claim 1 including a plurality of piezoelectric plates affixed in adjacent relation to the pressure chamber side of the carbon plate.

18. An ink jet head according to claim 17 wherein the orifice passages are formed in an edge of the carbon plate and including further passages extending between the orifice passages and the corresponding pressure chambers.

19. An ink jet head according to claim 1 wherein the orifice passages are formed in an edge of the piezoelectric plate and including passages extending perpendicular to the orifice passages and the pressure chambers to connect the pressure chambers to the orifice passages.

20. An ink jet head according to claim 1 wherein the carbon plate has a projecting portion containing the orifice passages and extending away from the side of the plate opposite from the pressure chambers.

21. An ink jet head according to claim 1 including a coating of a material having a high modulus of rigidity on the surfaces of the pressure chambers formed in the carbon plate.

22. A method for making an ink jet head comprising the steps of providing a carbon plate, forming the carbon plate with a plurality of orifice passages, with a plurality of pressure chambers communicating with the orifice passages, respectively, and with an ink supply passage leading to the pressure chambers, affixing a piezoelectric plate having a pattern of actuating electrodes to one side of the carbon plate so that the pattern of actuating electrodes is positioned adjacent to corresponding pressure chambers, and affixing an orifice plate having ink jet orifices to the carbon plate so that the orifices are aligned with the orifice passages in the carbon plate.

23. A method according to claim 22 including affixing the piezoelectric plate to the carbon plate with epoxy adhesive.

24. A method according to claim 22 including affixing the orifice plate to the carbon plate with epoxy adhesive.

25. A method according to claim 22 including forming the plurality of orifices in the orifice plate by electrical discharge machining.

26. A method according to claim 22 including affixing a piezoelectric plate having a conductive coating on the exposed surface to one side of the carbon plate and forming the actuating electrodes on the exposed surface of the piezoelectric plate by photo-etching the conductive coating.

27. A method for making an ink jet head comprising the steps of providing a carbon plate having a pattern of pressure chambers formed therein, affixing a piezoelectric plate having an exposed conductive surface to a surface of the plate having a pattern of pressure chambers formed therein and photo-etching the conductive coating on the piezoelectric plate to produce an electrode pattern conforming to the pattern of pressure chambers in the adjacent plate to which the piezoelectric plate is affixed.

28. A method according to claim 27 wherein the piezoelectric plate is affixed to the surface of the adjacent plate by spraying one of the surfaces of the plates with a thin layer of epoxy adhesive.

29. A method according to claim 27 wherein the photo-etching step is carried out by applying a layer of photoresist to the conductive coating, subjecting the photoresist to a radiation pattern, developing the photoresist, and etching the conductive layer in the region exposed by the developed photoresist.

30. A method of forming a plurality of ink jet head components comprising the steps of forming a plurality of patterns of orifice passages, pressure chambers and ink supply passages at a plurality of locations in a carbon plate, applying a plurality of piezoelectric plates having conductive coatings on the exposed surfaces thereof to one surface of the carbon plate, and photo-etching the conductive coatings on the piezoelectric plates to produce patterns of electrodes corresponding to the patterns of pressure chambers formed in the carbon plate.

31. A method according to claim 30 including separating the carbon plate into a plurality of plate portions, each including one of the piezoelectric plates.

32. A method for making an ink jet head comprising the steps of providing a porous carbon plate, forming a pattern of orifice passages, pressure chambers and ink supply passages in the porous carbon plate and coating the passages in the plate with an air-permeable, ink-impermeable layer.

33. A method according to claim 32 including affixing a piezoelectric plate to one side of the carbon plate adjacent to the pressure chambers formed therein, affixing an orifice plate having orifices aligned with the orifice passages to a surface of the carbon plate containing the orifice passages, and providing an exposed surface of the porous carbon plate for communication with a vacuum source.

* * * * *